United States Patent
Adachi

(10) Patent No.: US 7,267,713 B2
(45) Date of Patent: Sep. 11, 2007

(54) CONDUCTIVE PASTE AND GLASS CIRCUIT STRUCTURE

(75) Inventor: Fumiya Adachi, Ritto (JP)

(73) Assignee: Murata Manufacturing Co., Ltd. (JP)

( * ) Notice: Subject to any disclaimer, the term of this patent is extended or adjusted under 35 U.S.C. 154(b) by 203 days.

(21) Appl. No.: 10/802,922

(22) Filed: Mar. 18, 2004

(65) Prior Publication Data

US 2004/0214016 A1 Oct. 28, 2004

(30) Foreign Application Priority Data

Apr. 28, 2003 (JP) .............................. 2003-123358

(51) Int. Cl.
C09K 3/18 (2006.01)
H01B 1/02 (2006.01)

(52) U.S. Cl. ...................... 106/13; 106/1.14; 106/1.18; 106/1.21; 252/514; 252/518; 501/15; 501/19; 501/20; 501/21; 501/32

(58) Field of Classification Search ................ 252/514, 252/518, 519.51; 106/1.14, 1.18, 1.21, 13; 501/15, 32, 19–21

See application file for complete search history.

(56) References Cited

U.S. PATENT DOCUMENTS

| | | | |
|---|---|---|---|
| 5,202,292 A | | 4/1993 | Tanabe et al. |
| 5,378,408 A | * | 1/1995 | Carroll et al. ............... 252/514 |
| 5,417,745 A | * | 5/1995 | Oprosky et al. .............. 106/13 |
| 5,470,506 A | * | 11/1995 | Tanigami et al. ....... 252/520.22 |
| 5,795,501 A | * | 8/1998 | Kano .......................... 252/514 |
| 6,075,490 A | * | 6/2000 | Sakaguchi et al. ........... 343/704 |
| 6,689,296 B2 | * | 2/2004 | Nagai et al. ........... 252/519.52 |

FOREIGN PATENT DOCUMENTS

| | | |
|---|---|---|
| JP | 59-68101 | 4/1984 |
| JP | 09-092028 | 4/1987 |
| JP | 63-285804 | 11/1988 |
| JP | 3-149706 | 6/1991 |
| JP | 4-293214 | 10/1992 |
| JP | 5-174616 | 7/1993 |
| JP | 5-174617 | 7/1993 |
| JP | 7-105723 | 4/1995 |
| JP | 8-7645 | 1/1996 |
| JP | 8-17671 | 1/1996 |
| JP | 10-31912 | 2/1998 |
| JP | 2000-048642 | 2/2000 |
| JP | 2001-176327 | 6/2001 |
| JP | 2002-169273 | 6/2002 |

OTHER PUBLICATIONS

Chinese Office Action issued Sep. 9, 2005.

* cited by examiner

*Primary Examiner*—Cathy F. Lam
(74) *Attorney, Agent, or Firm*—Dickstein, Shapiro, LLP.

(57) ABSTRACT

Provided is a conductive paste capable of adjusting resistivity and forming a conductor film having high strength of bonding with a glass substrate and high mounting strength of a metal terminal. The conductive paste contains a conductive component, a glass frit having a composition containing a $Bi_2O_3$—$B_2O_3$—$SiO_2$—$Al_2O_3$ or $Bi_2O_3$—$B_2O_3$—$SiO_2$—$Al_2O_3$—$ZnO$ primary component and about 0.5 to 5% by weight of NiO as a secondary component, and an organic vehicle. The conductive paste is applied on a glass substrate and then baked to form a conductor film. A glass circuit structure formed by using the conductor film can be advantageously used as a defogging glass for an automobile window.

17 Claims, 2 Drawing Sheets

CONDUCTIVE PASTE AND GLASS CIRCUIT STRUCTURE

BACKGROUND OF THE INVENTION

1. Field of the Invention

The present invention relates to a conductive paste and a glass circuit structure comprising a conductive film formed on a glass substrate by using the conductive paste. Particularly, the present invention relates to a conductive paste and a glass circuit structure suitably used for a defogging glass for an automobile window.

2. Description of the Related Art

In an automobile rear window glass, for example, a heating conductor is disposed at the glass, for defogging or defrosting (simply referred to as "fogging prevention" or "defogging" hereinafter) so that the heating conductor is heated by passing a current through a conductor circuit including the conductor to keep the glass surface temperature at the dew point or higher.

In many cases, this heating conductor comprises a plurality of strips and bus bars connected to both ends of the strips formed on a glass surface. The heating conductor having such a structure comprises a conductor film formed by printing a conductive paste in a pattern on the glass surface and then baking the paste. Also, a lead-out metal terminal is connected to each of the bus bars by soldering or the like to form the conductor circuit in which the heating conductor is heated by applying a voltage between the metal terminals.

Since a constant-voltage power supply is used for applying the voltage applied the metal terminals, the quantity of heat generated from the heating conductor depends upon the shape, including the thickness, and the resistivity (volume resistivity) of the heating conductor. Therefore, it is desirable to realize conductors having various resistivity values from a material aspect in order to control the quantity of heat generated.

For example, a resistance adjuster is mixed with a conductive paste containing a silver powder, a low-melting-point glass frit and an organic vehicle, for adjusting the resistance of the paste to a desired value by controlling sintering, thereby adjusting the resistivity of a conductor (for example, refer to Japanese Unexamined Patent Application Publication Nos. 2000-48642 and 9-92028).

As the resistance adjuster, for example, a metal having high resistivity, such as Ni, Al, Sn, Pb, Pt, Pd or the like, or an oxide thereof, is used.

However, when the resistance adjuster is used, the metal terminals cannot be connected with sufficiently high strength in some cases. A possible reason for this is that when the above-described metal or oxide is added as the resistance adjuster to the conductive paste, the adjuster is solid-dissolved in glass frit in the burning process to inhibit flow of glass, thereby decreasing the bonding force between the heating conductor and a glass substrate. Another possible reason is that the amounts of oxides, which are not involved in soldering, in the sintered conductor film are increased to segregate the oxides near the surface of the conductor film, and the segregated oxides inhibit solderability to decrease the strength of bonding between the metal terminals and the heating conductor.

It is thought that in order to decrease the amount of the metal or oxide added, which is likely to cause the above problem, the properties such as the shape, particle diameter and crystallinity of the silver powder contained as a conductive component in the conductive paste can be changed to decrease the sinterability of the sliver powder. However, this countermeasure causes roughening of the silver sintered texture to easily produce cohesive failure in the conductor film and decrease the strength of bonding with the glass substrate.

SUMMARY OF THE INVENTION

Accordingly, an object of the present invention is to provide a conductive paste capable of facilitating adjustment of the resistivity of a conductor film formed by using the conductor paste, and imparting high mounting strength to a metal terminal mounted on the conductor film. Specifically, the present invention provides a conductive paste capable of increasing the strength of bonding between a conductor film and a glass substrate and the strength of bonding between a metal terminal and the conductor film.

Another object of the present invention is to provide a glass circuit structure comprising a conductor film formed on a glass substrate by using the conductive paste.

In order to solve the above technical problem, a conductive paste of the present invention comprises a conductive component, a glass frit and an organic vehicle, wherein the glass frit has a composition containing a $Bi_xO_3$—$B_2O_3$—$SiO_2$—$Al_2O_3$ or $Bi_2O_3$—$B_2O_3$—$SiO_2$—$Al_2O_3$—$ZnO$ primary component, and about 0.5 to 5% by we NiO as a secondary component.

The glass frit preferably has a composition containing about 60 to 85% by weight of $Bi_2O_3$, about 3 to 10% by weight of $B_2O_3$, about 2 to 15% by weight of $SiO_2$, about 3 to 7% by weight of $Al_2O_3$, 0 to about 15% by weight of ZnO, and about 0.5 to 5% by weight of NiO.

The conductive component preferably contains at least one of silver, silver-palladium, platinum, gold, and rhodium.

The conductive paste of the present invention may further comprise about 2% by weight or less of at least one of alumina, amorphous silica and $MoSi_2$.

A glass circuit structure of the present invention comprises a glass substrate, and a conductor circuit including a conductor film formed on the glass substrate. In the glass circuit structure of the present invention, the conductor film is formed by applying the conductive paste of the present invention on the glass substrate and then baking the paste.

The glass circuit structure of the present invention is advantageously used as, for example, a defogging glass for an automobile window.

DESCRIPTION OF THE PREFERRED EMBODIMENTS

Figure 1:
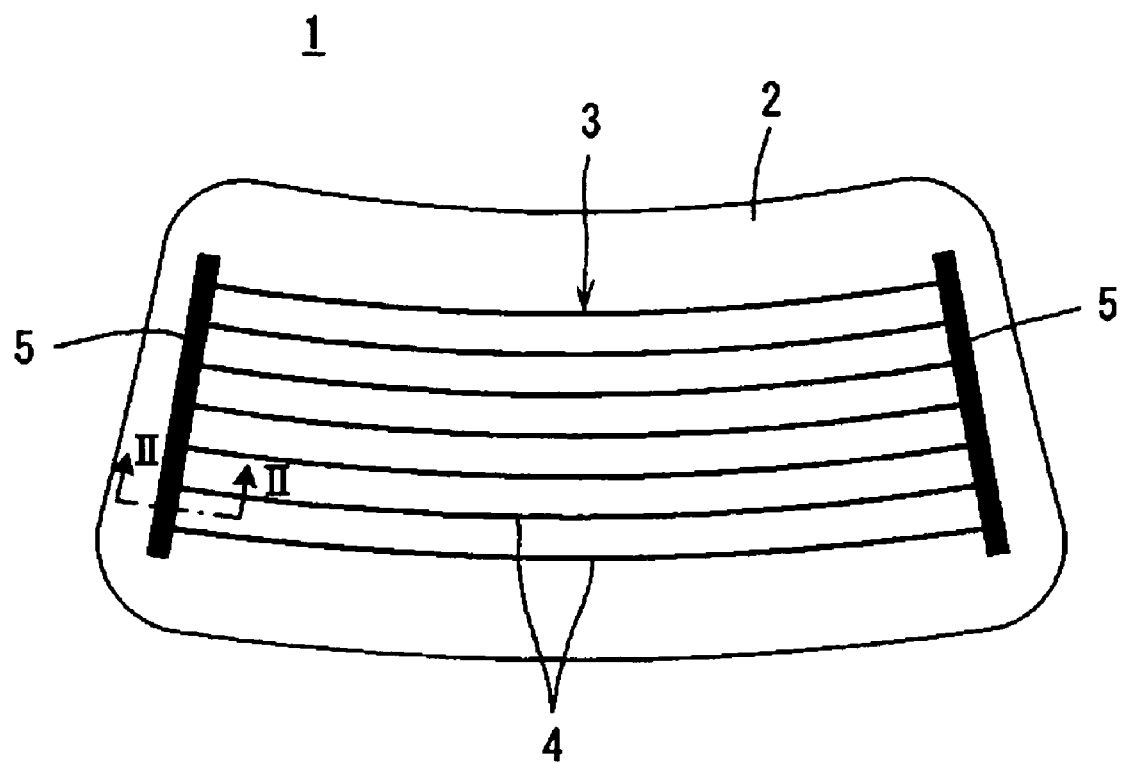
FIG. 1 is a front view schematically showing an automobile window defogging glass to which a conductive paste of the present invention can be advantageously applied.

FIG. 1 is a front view schematically showing an automobile window defogging glass to which a conductive paste of the present invention can be advantageously applied. For example, the defogging glass 1 shown in FIG. 1 can constitute an automobile rear window.

The defogging glass 1 comprises a glass substrate 2 and a conductor circuit including a heating conductor film 3 formed on the glass substrate 2. The heating conductor film 3 comprises a plurality of strips 4 and bus bars 5 connected to both ends of the plurality of strips 4, the strips and bus bars 5 being formed on the glass substrate 2. The conductor film 3 having this structure is formed by applying the conductive paste of the present invention in a predetermined pattern on the glass substrate 2 by printing or the like, and then baking the paste.

Figure 2:
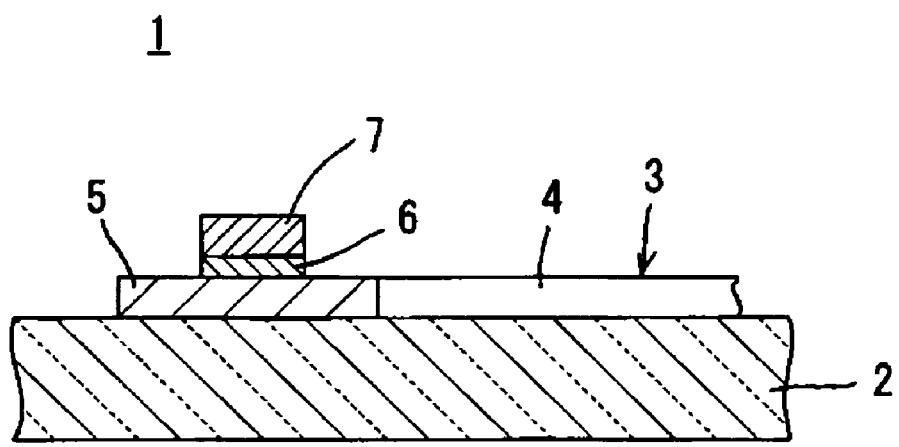
FIG. 2 is an enlarged sectional view taken along line II—II in FIG. 1.

FIG. 2 is an enlarged sectional view taken along line II—II in FIG. 1.

As shown in FIG. 2, a metal terminal 7 is mounted on each of the bus bars 5 thorough solder 6, for mounting a lead terminal. When a voltage is applied between the metal terminals 7 to pass a current through the conductor circuit including the conductor film 3 and the metal terminals 7, the conductor film 3, particularly the strips 4, generate heat. The generated heat maintains the surface temperature of the defogging glass 1 at the dew point or higher, thereby exhibiting a defogging effect.

Although not shown in the drawing, a film made of black color ceramic comprising a mixture of glass and ceramic may be formed, by baking, on a region of the glass substrate 2 where each bus bar 5 to be formed, and each of the bus bars 5 may be formed on the film made of the black ceramic. If desired, there may be only one bus bar.

The conductive paste constituting the heating conductor film 3 comprises a conductive component, a glass frit, and an organic vehicle. The conductive component is usually about 60–85% by weight of the paste. With a content of less than about 60%, the conductor film gets thinner and the reliability of the conductor film can degrade. With a content of more than about 85%, it can be difficult to keep the viscosity of the paste within proper limits. The content of the glass frit is usually about 3–7% by weight. With a content of less than about 3%, the adherence of the conductor film to the substrate decreases and with a content of more than about 7%, the amount of the frit appearing on the surface of the conductor film increases and this can prevent achieving a good solder joint. The organic vehicle constitutes the balance of the paste and is, therefore, about 8–37% by weight.

As the conductive component, silver is typically used and contained in a powder state in the conductive paste. In addition to silver, a conductive metal, for example, palladium, platinum, rhodium or the like, may be added as a conductive component, for controlling the resistance and solder leach property of the conductor film 3. At least one of palladium, platinum, gold and rhodium may be added in the form of an alloy with silver, in the form of a powder other than the silver powder, or in the form of an organic metal.

The mean particle diameter of the conductive metal powder used as the conductive component is preferably about 20 µm or less, more preferably about 0.1 µm to 10 µm, and most preferably about 0.1 µm to 6 µm in view of printability of the conductive paste. Also, a mixture of at least two conductive metal powders having different mean particle diameters or a mixture of at least two leaf-shaped powders having different shapes may be used for improving the control of printability and sinterability.

The glass frit contained in the conductive paste has the composition comprising a $Bi_2O_3$—$B_2O_3$—$SiO_2$—$Al_2O_3$ or $Bi_2O_3$—$B_2O_3$—$SiO_2$—$Al_2O_3$—$ZnO$ primary component, and about 0.5 to 5% by weight of NiO as a secondary component.

Although the glass component contained in the glass flit originally functions as a sintering aid for the conductive metal powder such as the silver powder or the like, in the burning process, the secondary component NiO functions to decrease the wettability of glass with the conductive metal powder to decrease the function of the glass component contained as the sintering aid in the glass fit. As a result, the particle growth of the conductive component such as silver is suppressed in the burning process to increase the resistivity of the obtained conductor film.

Also, NiO partially precipitates in the grain boundaries of the conductive component such as silver in the burning process to inhibit conductivity in the grain boundaries. Therefore, it is supposed that NiO has the effect of increasing the resistivity of the conductor film.

Therefore, the resistivity of the conductor film can be controlled by controlling the content of NiO as the secondary component of the glass frit. It is thus possible to decrease the necessary amount of the resistance adjuster or make it unnecessary, the resistance adjuster being conventionally added to the conductive paste separately from the glass frit, for controlling resistivity. As a result, the adverse effect of the resistance adjuster, i.e., a decrease in solderability of the conductor film and the strength of bonding between the conductor film and the glass substrate can be inhibited or prevented.

The reason for selecting the content of NiO contained as the secondary component in the glass frit in the range of about 0.5 to 5% by weight is that with a content of less than about 0.5% by weight, the effect of NiO cannot be obtained, while with a content of over about 5% by weight, the melting point of the glass frit increases to decrease the strength of bonding between the glass substrate and the conductor film.

In the use of a glass frit containing NiO at a content near 5% by weight, bonding with the glass substrate may become unstable due to an increase in the melting point. In this case, another glass frit having a low melting point may be mixed to a degree which does not deteriorate the resistivity of the conductor film.

The automobile window defogging glass 1 shown in FIG. 1 is usually subjected to bending in the temperature range of 570 to 700° C. Therefore, the conductive paste coated on the glass substrate 2 must contain a glass component which flows in the temperature range to produce a good state of bonding with the glass substrate 2. The glass frit contained in the conductive paste of the present invention can satisfy this requirement.

The glass frit preferably has a composition comprising about 60 to 85% by weight of $Bi_2O_3$, about 3 to 10% by weight of $B_2O_3$, about 2 to 15% by weight of $SiO_2$, about 3 to 7% by weight of $Al_2O_3$, 0 to about 15% by weight of ZnO and about 0.5 to 5% by weight of NiO.

$Bi_2O_3$ functions as a flux component. With less than about 60% by weight of $Bi_2O_3$, the softening point excessively increases to deteriorate fluidity, thereby causing insufficient baking of the resulting conductor film in some cases. With over about 85% by weight or $Bi_2O_3$, crystallization easily occurs in the baking temperature range to deteriorate fluidity, thereby deteriorating chemical durability and the strength of bonding with the glass substrate in some cases.

$B_2O_3$ also functions as a flux component. With less than about 3% by weight of $B_2O_3$, the softening point excessively increases, while with over about 15% by weight of $B_2O_3$, chemical durability may deteriorate.

$SiO_2$ functions as a network former functioning to control chemical, thermal and mechanical characteristics. With less than about 2% by weight of $SiO_2$, chemical durability deteriorates, while with over about 15% by weight of $SiO_2$, the softening point excessively increases in some cases.

$Al_2O_3$ contributes to an improvement in chemical durability. Particularly, the glass frit containing $Bi_2O_3$ is easily corroded with salt water or the like to possibly cause fatal defects in the conductor film used in an exposed state in the external environment. However, $Al_2O_3$ can provide high durability against an attack of chloride ions. With less than about 3% by weight of $Al_2O_3$, the effect of improving chemical durability is low, while with over about 7% by weight $Al_2O_3$, the softening point excessively increases in some cases.

ZnO functions as a flux component and is contained according to need. With over about 15% by weight of ZnO, chemical durability deteriorates in some cases.

The organic vehicle contained in the conductive paste of the present invention functions to form a paste containing the inorganic components such as the conductive component and the glass frit. As the organic vehicle, any organic resin which can impart printability to the conductive paste can be used, and a solution of a general, easily-available commercial resin such as an ethyl cellulose resin, an acryl resin, an alkyd resin or the like in a solvent such as α-terpineol, butyl carbitol acetate or the like, is preferably used.

Also, the conductive paste may contain at least one of alumina, amorphous silica and $MoSi_2$ according to need. The alumina, amorphous silica or $MoSi_2$ can contribute to stability of the initial characteristics and reliability of the conductor film and provide high reliability to a glass containing $Bi_2O_3$, thereby securing stability of the resulting conductor film over a long period of time.

Particularly, alumina exhibits an effect on the stability of glass containing $Bi_2O_3$. The glass containing $Bi_2O_3$ reacts with a halide, particularly a chloride, to form a salt, and thus the glass may be broken, and consequently, the strength of bonding between the conductor film and the glass substrate possibly changes with time. However, the stability can be significantly improved by adding alumina.

The amorphous silica contributes to an improvement in the coloring property at the back of the conductor film, which is important from the view point of design.

Furthermore, $MoSi_2$ reacts with glass to form a solid solution, thereby deteriorating the fluidity of the glass and improving the wettability with the glass substrate. Therefore, the glass component of the conductive paste is segregated in the baking process at the interface between the conductor film and the glass substrate to decrease floating of the glass component to the surface of the conductor film, thereby improving solderability.

When at least one of alumina, amorphous silica and $MoSi_2$ is excessively added, the fluidity of glass is significantly decreased to cause insufficient sintering. Therefore, the adding amount is preferably about 2% by weight or less.

Next, experimental examples performed for confirming the effect of the conductive paste of the present invention will be described.

EXPERIMENTAL EXAMPLES

1. Evaluation Items of Conductive Paste

The essential evaluation items, i.e., volume resistivity, bonding strength and solderability, of a conductive paste used for forming a heating conductor film for an automobile rear window were evaluated by the following methods.

The conductive paste to be evaluated was prepared by mixing at least a silver powder, a glass frit and an organic vehicle, and then dispersing the resulting mixture with a three-roll mill.

(1) Volume Resistivity

The conductive paste was printed on a slide glass substrate (soda lime glass, 260 mm×760 mm×1.4 mmt) by using a resistivity measurement pattern having a line length L of 200 mm and a line width of 0.4 mm, and then baked by a burning process in which the substrate was maintained at a maximum temperature of 600° C. for 1 minute to form a conductor film.

Next, the line resistance and thickness of the conductor film were measured. The line resistance was measured using "Multimeter" (produced by HEWLETT PAKARD Co., Ltd.) as a resistance measuring apparatus. The thickness was measured by using a contact thickness measuring meter "Surfcom" (produced by Tokyo Seimitsu Co., Ltd.) as a thickness measuring apparatus.

Next, each of the measurements of the line resistance and thickness measured as described above was substituted into the following equation to calculate volume resistivity ρ.

$$\rho(\mu\Omega\cdot cm) = [\text{Thickness }(\mu m) \times \text{Line resistance }(\Omega) \times W (0.4\text{ mm})/L(200\text{ mm})] \times 100$$

Each of the values of line resistance and thickness substituted into the above equation was a mean value of five measurements of each sample.

(2) Bonding Strength

The conductive paste was printed on a slide glass substrate (soda lime glass, 260 mm×760 mm×1.4 mmt) by using a 2-mm square pattern, and then maintained at a maximum temperature of 600° C. for 1 minute in a burning process to form a conductor film.

Next, the slide glass substrate having the conductor film formed thereon was placed on a plate heated to 150° C., and a lead terminal was soldered to the conductor film. As the lead terminal, a L-shaped solder-coated copper wire having a diameter of 0.6 mm was used. Sn—Pb—Ag system solder was used as solder, and a flux comprising rosin dissolved in isopropyl alcohol was used.

Next, the lead terminal was pulled by "Autograph" (produced by Shimadzu Corporation) used as a tensile tester to determine bonding strength when the conductor film was separated from the slide glass substrate. 10 N or more of bonding strength is necessary for practical use.

(3) Solderability

The conductive paste was printed on a slide glass substrate (soda lime glass, 260 mm×760 mm×1.4 mmt) by using a circular pattern having a diameter of 5 mm, and then dried at a temperature of 150° C. and then held at a maximum temperature of 600° C. for 1 minute in a burning process to form a conductor film.

Next, the surface of the conductor film was cleaned with a flux, and then dipped in a Sn—Pb—Ag system solder bath for 2 to 3 seconds.

After dipping, the surface of the conductor film was visually observed to decide whether solderability was good or bad. The decision was made on the criteria that solderability was "good" when the solder coating area on the surface of the conductor film was 90% or more, and solderability was "bad" when the solder coating area was less than 90%.

2. Preparation of Glass Frit $Bi_2O_3$, $SiO_2$, $H_3BO_3$, $Al(OH)_3$, NiO and ZnO were prepared as starting materials, and mixed at each of the composition ratios shown in Tables 1 and 2. Each of the resultant mixtures was placed in an alumina crucible and melted at a temperature of 1200° C. and then vitrified by rapid cooling. The resulting glass was ground with a zirconia ball to obtain a glass frit of each sample.

Table 1 shows Samples A to E of glass frit (Bi system glass frit) containing a $Bi_2O_3$—$B_2O_3$—$SiO_2$—$Al_2O_3$ primary component, and Table 2 shows Samples F to J of glass frit (Bi—Zn system glass frit) containing a $Bi_2O_3$—$B_2O_3$—$SiO_2$—$Al_2O_3$—ZnO primary component.

TABLE 1

| | Bi system glass frit | | | | |
|---|---|---|---|---|---|
| | A | B | C | D | E |
| $Bi_2O_3$ (% by weight) | 83 | 82 | 82 | 82 | 81 |
| $SiO_2$ (% by weight) | 2 | 2 | 2 | 2 | 2 |
| $B_2O_3$ (% by weight) | 8 | 9 | 7 | 6 | 7 |
| $Al_2O_3$ (% by weight) | 7 | 6.5 | 6 | 5 | 3 |
| NiO (% by weight) | 0 | 0.5 | 3 | 5 | 7 |

TABLE 2

| | Bi—Zn system glass frit | | | | |
|---|---|---|---|---|---|
| | F | G | H | I | J |
| $Bi_2O_3$ (% by weight) | 60 | 63 | 64 | 65 | 66 |
| $SiO_2$ (% by weight) | 13 | 12.5 | 12 | 10 | 8 |
| $B_2O_3$ (% by weight) | 8 | 6 | 4 | 3 | 3 |
| $Al_2O_3$ (% by weight) | 4 | 3 | 3 | 3 | 2 |
| ZnO (% by weight) | 15 | 15 | 14 | 14 | 14 |
| NiO (% by weight) | 0 | 0.5 | 3 | 5 | 7 |

3. Experimental Example 1

In Experimental Example 1, the relationship between the Ni content of a glass frit and the volume resistivity of a conductor film was examined for confirming that NiO contained as a secondary component in the glass frit has the effect of adjusting the resistance of the conductor film.

The conductive paste used as a sample had a composition comprising 75% by weight of silver powder, 5% by weight of glass frit and 20% by weight of an organic vehicle. The used silver powder comprised spherical particles having an average particle diameter of 1 μm to 2 μm. As the glass frit, each of Bi—system glass frits A to E shown in Table 1 and Bi—Zn system glass frits F to J shown in Table 2 was used. The organic vehicle comprised a 8% by weight solution of cellulose resin in terpineol.

Figure 3:
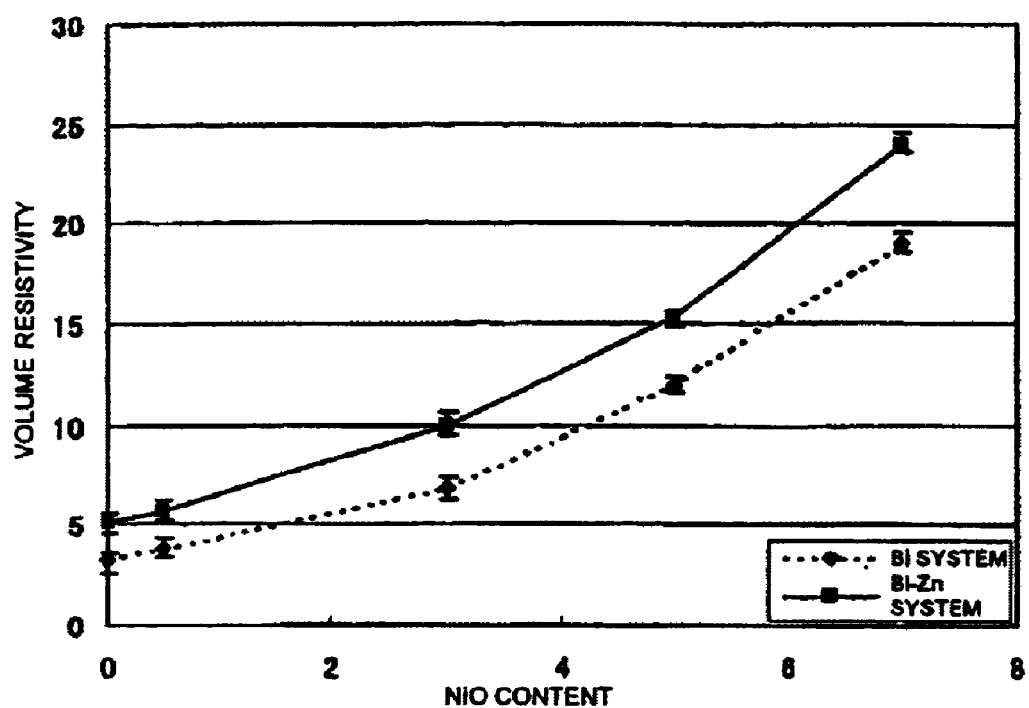
FIG. 3 is a graph showing the relationship determined between the NiO content of a glass frit and the volume resistivity of a conductor film in Experimental Example 1 of the present invention.

FIG. 3 shows the relationship between the NiO content of the glass frit and the volume resistivity of the conductor film.

FIG. 3 shows that in either of the Bi system glass frit and the Bi—Zn system glass frit, the volume resistivity of the conductor film increases as the NiO content of the glass frit increases. Also, with a sample having a NiO content of 0.5% by weight, the volume resistivity is increased by about 10% in comparison to a sample having a NiO content of 0% by weight. It can thus be concluded that the lower limit of the NiO content which permits clear confirmation of the effect of NiO added is about 0.5% by weight.

It is also found that with a NiO content of about 5% by weight, a high-resistivity value (12 μΩ·cm to 13 μΩ·cm) in the desired volume resistivity of a heating conductor film formed on a defogging glass can be achieved.

4. Experimental Example 2

In Experimental Example 2, the volume resistivity, bonding strength and solderability of each of conductor films formed by using conductive pastes having different compositions were measured in order to obtain characteristics on the high-resistivity side of the required volume resistivity range of a heating conductor film formed in a defogging glass for an automobile rear window.

A conductive paste having each of the compositions shown in Table 3 was prepared as a sample. As a glass frit, glass frits A and F not containing NiO and glass frits C to E and H to J each containing 3 to 7% by weight of NiO shown in Tables 1 and 2 was used. In some of the samples, alumina was added to the conductive paste as shown in Table 3.

TABLE 3

| Sample No. | Silver powder (% by weight) | Glass frit Type | Glass frit (% by weight) | Alumina (% by weight) | Organic vehicle (% by weight) |
|---|---|---|---|---|---|
| 1 | 75 | A | 5 | — | 20 |
| 2 | 75 | A | 5 | 2 | 18 |
| 3 | 75 | A | 5 | 3 | 17 |
| 4 | 75 | C | 5 | — | 20 |
| 5 | 75 | D | 5 | — | 20 |
| 6 | 75 | E | 5 | — | 20 |
| 7 | 75 | F | 5 | — | 20 |
| 8 | 75 | F | 5 | 2 | 18 |
| 9 | 75 | F | 5 | 3 | 17 |
| 10 | 75 | H | 5 | — | 20 |
| 11 | 75 | I | 5 | — | 20 |
| 12 | 75 | J | 5 | — | 20 |

Table 4 shows the volume resistivity, bonding strength and solderability measured for the conductor film formed using the conductive paste having each of the compositions shown in Table 3.

TABLE 4

| Sample No. | Volume resistivity (μΩ·cm) | Bonding strength (N) | Solderability |
|---|---|---|---|
| 1 | 3.2 | 25 | Good |
| 2 | 5.8 | 23 | Good |
| 3 | 12.2 | 6 | Bad |
| 4 | 11.0 | 26 | Good |
| 5 | 12.1 | 25 | Good |
| 6 | 19.3 | 8 | Good |
| 7 | 5.1 | 26 | Good |
| 8 | 7.8 | 25 | Good |
| 9 | 14.2 | 8 | Bad |
| 10 | 12.2 | 25 | Good |
| 11 | 15.1 | 28 | Good |
| 12 | 24.5 | 9 | Good |

In comparison between Samples 1 to 3 each of which was prepared using the conductive paste containing the Bi system glass frit A not containing NiO, and in comparison between Samples 7 to 9 each of which was prepared using the conductive paste containing the Bi—Zn system glass frit F not containing NiO as shown in Table 3, a volume resistivity of 12 μΩ·cm or more was obtained only in Samples 3 and 9 as shown in Table 4. However, as shown in Table 3, a relatively large amount (3% by weight) of alumina was added to the conductive paste of Samples 3 and 9. As a result, as shown in Table 4, the bonding strength is significantly decreased, and the solderability is inhibited in Samples 3 and 9.

On the other hand, in Samples 4, 5, 10 and 11 prepared using the conductive pastes containing the glass frits C, D, H and I, respectively, each containing 3 to 5% by weight of NiO as shown in Table 3, sufficient bonding strength and solderability can be achieved with the volume resistivity maintained at a relatively high value, as shown in Table 4.

In Samples 6 and 12 prepared using the conductive pastes containing the glass frits E and J, respectively, each containing over about 5% by weight (7% by weight) of NiO, as shown in Table 3, high volume resistivity and good solderability are exhibited, while bonding strength significantly deteriorates, as shown in Table 4. This is possibly due to the phenomenon that the softening point of the glass frit is increased to deteriorate the strength of bonding between the slide glass substrate and the conductor film.

As described above, the conductive paste of the present invention comprises a glass frit containing a $Bi_2O_3$—$B_2O_3$—$SiO_2$—$Al_2O_3$ or $Bi_2O_3$—$B_2O_3$—$SiO_2$—$Al_2O_3$—ZnO primary component, and about 0.5 to 5% by weight of NiO as a secondary component. Therefore, the resistivity (volume resistivity) of a conductor film formed by baking the conductive pate can be controlled by controlling the NiO content.

In order to obtain a conductor film having relatively high resistivity, a resistance adjuster is conventionally added separately from the glass frit. However, the necessary amount of the resistance adjuster can be decreased, or the resistance adjuster can be made unnecessary in the present invention. Therefore, the adverse effect of the resistance adjuster can be decreased or avoided, thereby achieving a conductor film having good solderability and high strength of bonding with a glass substrate. As a result, the mounting strength of a metal terminal soldered to the conductor film can be increased when the conductive paste of the present invention is used for forming a conductor film on a glass substrate, Therefore, a glass circuit structure formed by using the conductive paste of the present invention can be advantageously used for a defogging glass for an automobile window.

When the glass frit of the conductive paste of the present invention has a composition containing about 60 to 85% by weight of $Bi_2O_3$, about 3 to 10% by weigh of $B_2O_3$, about 2 to 15% by weight of $SiO_2$, about 3 to 7% by weight of $Al_2O_3$, 0 to about 15% by weight of ZnO, and about 0.5 to 5% by weight of NiO, the above-described effect can be securely exhibited, and the chemical durability of the obtained conductor film can be further improved.

When the conductive paste of the present invention contains about 2% by weight or less of at least one of alumina, amorphous silica and $MoSi_2$, the initial characteristics and reliability of the conductor film formed by baking the conductive paste can be stabilized.

What is claimed is:

1. A conductive paste comprising:
a conductive component;
a glass frit comprising a $Bi_2O_3$—$B_2O_3$—$SiO_2$—$Al_2O_3$ or $Bi_2O_3$—$B_2O_3$—$SiO_2$—$Al_2O_3$—ZnO glass as primary component and about 0.5 to 5% by weight of NiO as a secondary component; and
an organic vehicle,
wherein the glass contains about 60 to 85% by weight of $Bi_2O_3$, about 3 to 10% by weight of $B_2O_3$, about 2 to 15% by weight of $SiO_2$, about 3 to 7% by weight of $Al_2O_3$, and 0 to about 15% by weight of ZnO.

2. A conductive paste according to claim 1, wherein the conductive component is at least one of silver, silver-palladium, platinum, gold, and rhodium.

3. A conductive paste according to claim 2, further comprising about 2% by weight or less of an additional paste component which is at least one of alumina, amorphous silica and $MoSi_2$.

4. A conductive paste according to claim 3, wherein the conductive component is a metal powder having a mean particle size of less than about 20 μm.

5. A conductive paste according to claim 4, wherein the metal powder has a mean particle size of about 0.1 to 10 μm.

6. A conductive paste according to claim 5, wherein the metal powder has a mean particle size of about 0.1 to 6 μm.

7. A conductive paste according to claim 1, further comprising about 2% by weight or less of an additional paste component which is at least one of alumina, amorphous silica and $MoSi_2$.

8. A conductive paste according to claim 1, wherein the conductive component is a metal powder having a mean particle size of less than about 20 μm.

9. A conductive paste according to claim 8, wherein the metal powder has a mean particle size of about 0.1 to 10 μm.

10. A conductive paste according to claim 8, wherein the metal powder has a mean particle size of about 0.1 to 6 μm.

11. A conductive paste according to claim 1, disposed on a glass substrate in a conductor circuit pattern.

12. A glass circuit structure comprising :
a glass substrate; and
a conductor circuit comprising a conductor film on the glass substrate;
wherein the conductor film is a baked conductive paste according to claim 1.

13. A glass circuit structure according to claim 12, wherein the glass substrate is a defogging glass of an automobile window.

14. A glass circuit structure comprising:
a glass substrate; and
a conductor circuit comprising a conductor film on the glass substrate;
wherein the conductor film is a baked conductive paste according to claim 4.

15. A glass circuit structure according to claim 12, wherein the glass substrate is a defogging glass of an automobile window.

16. A glass circuit structure comprising:
a glass substrate; and
a conductor circuit comprising a conductor film on the glass substrate;
wherein the conductor film is a baked conductive paste according to claim 4.

17. A glass circuit structure according to claim 16, wherein the glass substrate is a defogging glass of an automobile window.

* * * * *